(12) United States Patent
Horel

(10) Patent No.: US 8,395,454 B2
(45) Date of Patent: Mar. 12, 2013

(54) SYNCHRONIZED OUTPUT OF MULTIPLE RING OSCILLATORS

(75) Inventor: Timothy Horel, Santa Clara, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 13/107,079

(22) Filed: May 13, 2011

(65) Prior Publication Data

US 2012/0286883 A1  Nov. 15, 2012

(51) Int. Cl.
*H03K 3/03* (2006.01)
(52) U.S. Cl. .............................. 331/57; 331/55; 331/56
(58) Field of Classification Search .................... 331/57, 331/55, 56
See application file for complete search history.

(56) References Cited

U.S. PATENT DOCUMENTS

| 7,733,189 B1 * | 6/2010 | Bennett ......................... 331/64 |
| 2008/0256503 A1 | 10/2008 | Goodnow et al. |
| 2010/0045390 A1 * | 2/2010 | Barasinski ..................... 331/57 |

FOREIGN PATENT DOCUMENTS

| WO | 2010058249 | 5/2010 |
| WO | 2011081951 | 7/2011 |

OTHER PUBLICATIONS

International Search Report and Written Opinion in Application No. PCT/US2012/037814 mailed Sep. 14, 2012.

* cited by examiner

*Primary Examiner* — Joseph Chang
(74) *Attorney, Agent, or Firm* — Meyertons Hood Kivlin Kowert & Goetzel; Erik A. Heter

(57) ABSTRACT

A circuit for producing a synchronized output of multiple ring oscillators is disclosed. In one embodiment, the circuit includes a first ring oscillator configured to generate a first periodic signal and a second ring oscillator configured to generate a second periodic signal. The circuit may further include a selection unit coupled to receive the first periodic signal and the second periodic signal. The selection unit is configured to convey a first clock edge into each of the first and second ring oscillators responsive to a most recently received rising edge from one of the first and second periodic signals. The selection unit is further configured to convey a second clock edge into each of the first and second ring oscillators responsive to a most recently received falling edge from one of the first and second periodic signals, wherein the first and second clock edges are opposite in direction.

17 Claims, 6 Drawing Sheets

SYNCHRONIZED OUTPUT OF MULTIPLE RING OSCILLATORS

BACKGROUND

1. Field of the Invention

This invention relates to electronic circuits, and more particularly, to ring oscillator circuits.

2. Description of the Related Art

Many modern integrated circuits employ frequency scaling and/or voltage scaling as a method of balancing performance and power consumption. A combination of these two types of scaling, known as dynamic voltage frequency scaling (DVFS) may provide both voltage and frequency scaling. Using DVFS, voltage and frequency may be increased for workloads requiring higher performance. For workloads that are have a lower performance demand, voltage and frequency may be decreased in order to save power. Voltage and frequency may also be reduced in response to higher operating temperatures in some ICs.

The variations in voltage in utilizing DVFS may affect various components. In many ICs, ring oscillators may be used to generate required clock signals. The frequency of a signal produced by a ring oscillator may be a function of voltage. The frequency of a periodic signal produced by a ring oscillator may increase as voltage increases, while the frequency may decrease as voltage decreases. Accordingly, ring oscillators may be useful in producing clock signals for IC's which utilize DVFS. Individual ring oscillators may have specific characteristics with respect to the frequency of a periodic signal produced relative to a voltage received. For ICs and components thereof that utilize DVFS, ring oscillators may be selected having characteristics that correlate with their respective clock load(s), thereby allowing a linear or nearly linear approximation of operating frequency as a function of voltage over a selected voltage range.

SUMMARY OF THE DISCLOSURE

A circuit for producing a synchronized output of multiple ring oscillators is disclosed. In one embodiment, the circuit includes a first ring oscillator configured to generate a first periodic signal and a second ring oscillator configured to generate a second periodic signal. The circuit may further include a selection unit coupled to receive the first periodic signal and the second periodic signal. The selection unit is configured to convey a first clock edge into each of the first and second ring oscillators responsive to a most recently received rising edge from one of the first and second periodic signals. The selection unit is further configured to convey a second clock edge into each of the first and second ring oscillators responsive to a most recently received falling edge from one of the first and second periodic signals, wherein the first and second clock edges are opposite in direction.

In one embodiment, a method includes a first ring oscillator generating a first periodic signal and a second ring oscillator generating a second periodic signal. The method further includes a selection unit conveying a first clock edge into each of the first and second ring oscillators responsive to a most recently received rising clock edge from one of the first and second periodic signals. The selection unit may also convey a second clock edge into each of the first and second ring oscillators responsive to a most recently received falling clock edge from one of the first and second periodic signals. The first and second clock edges occur in opposite directions.

An integrated circuit having a plurality of ring oscillators and a selection unit is also contemplated.

BRIEF DESCRIPTION OF THE DRAWINGS

Other aspects of the invention will become apparent upon reading the following detailed description and upon reference to the accompanying drawings in which.

Figure 1:
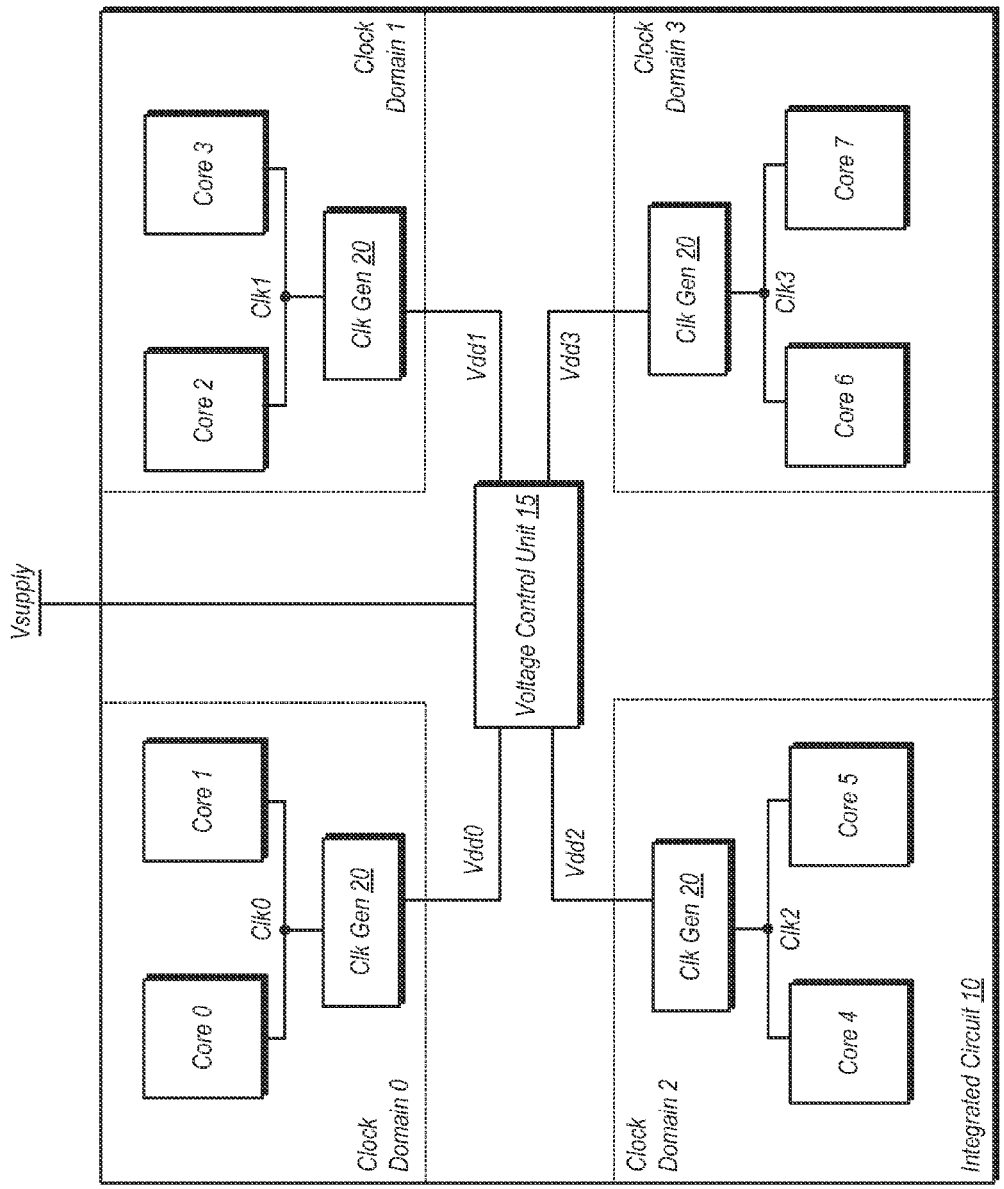
FIG. 1 is a block diagram of one embodiment of an integrated circuit (IC)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Turning now to FIG. 1, a block diagram of one embodiment of an integrated circuit (IC) is shown. In the embodiment shown, IC 10 is a processor having a number of processor cores (core 0-core 7 in this example). The cores are grouped into pairs, with each pair residing in separate clock domain with respect to the other cores. For example, core 0 and core 1 reside in clock domain 0, core 2 and core 3 reside in clock domain 1, and so on. Each core pair in the embodiment shown is coupled to a clock generator 20, and is thus coupled to receive a corresponding clock signal therefrom. Clock signal Clk0 is generated in clock domain 0, Clk1 is generated in clock domain 1, and so on. Each of the clock signals is independent of those generated in the other clock domains, and thus may differ in frequency at least some of the time during operation. The clock signals generated by each clock generator 20 may be provided to a clock tree or other structure within the respective core pair to which it is coupled.

IC 10 in this example implements dynamic voltage and frequency scaling (DVFS), and thus includes voltage control unit 15. Each clock generation unit 20 may thus receive a unique voltage from voltage control unit 15, and each of these voltages may be changed during operation. As will be explained below, each clock generator unit 20 may generate its respective clock signal using ring oscillators. The frequency of the respective clock signals produced may vary based on a received voltage. Accordingly, IC 10 may implement DVFS for a given core pair by increasing or decreasing the voltage provided to its corresponding clock generator 20. Thus, if an increased workload is assigned to one or both cores of a core pair, voltage control unit 15 may increase the voltage provided to its corresponding clock generator 20 and thus increase the frequency of the respective clock signal. If the workload for the core pair is decreased, the voltage provided to the corresponding clock generator 20 may also be decreased, thus causing the frequency of the corresponding clock signal to be decreased.

It is noted that in some embodiments, each clock domain may coincide with a power domain. Thus, as the frequency of the clock signal of a particular clock domain is increased, the supply voltage received by the circuits therein may also be increased. Similarly, if the clock frequency is decreased, the voltage supplied to the circuits in that clock domain may also be decreased.

As noted above, each clock generator 20 may be implemented using ring oscillators. One way of characterizing a ring oscillator is by the relationship between the voltage it receives and the frequency of the clock signal it produces. This relationship is sometimes referred to as the transfer characteristic. Based on its transfer characteristic, a particular ring oscillator may be more suitable for use with certain operating parameters. At lower voltages, some paths through an IC may be considered as circuit (or transistor) dominated paths, having a higher sensitivity to changes in voltage. At higher voltages, some paths through the IC may be considered as wire-dominated paths, which are less sensitive to changes in voltage. In some cases, a particular ring oscillator may be more suitable for use with a transistor-dominated path, while having less sensitivity with respect to wire-dominated paths. Accordingly, at higher voltages, frequency scaling may be limited for ring oscillators that are more suitable for transistor-dominated paths. Conversely, frequency scaling may be limited at lower voltages when using a ring oscillator more suited for a wire-dominated path. However, clock generator 20 may utilize multiple ring oscillators having different characteristics in order to implement an apparatus suitable for use at lower voltages (for transistor-dominated paths) as well as higher voltages (for wire-dominated paths). Furthermore, since the ring oscillators may have different transfer characteristics with respect to each other, clock generator 20 may provide a seamless crossover point for sensitivity with respect to transistor-dominated paths and wire-dominated paths.

Figure 2:
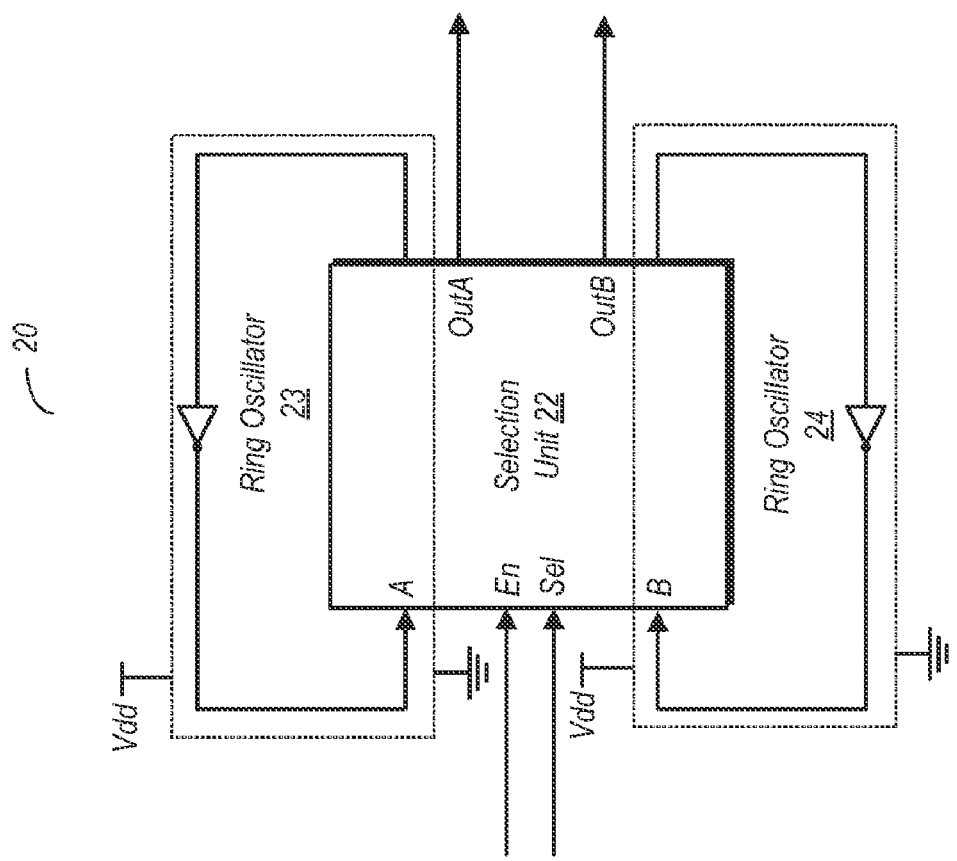
FIG. 2 is a block diagram illustrating one embodiment of a circuit configured to provide a synchronized output for two different ring oscillators.

FIG. 2 is a block diagram illustrating one embodiment of a circuit configured to provide a synchronized output for two different ring oscillators. In the embodiment shown, clock generator 20 includes ring oscillators 23 and 24 and selection unit 22 to which they are coupled. Each of ring oscillators 23 and 24 may receive a common supply voltage, Vdd. Selection unit 22 is configured to receive an enable signal ('En') and a selection signal ('Sel'). Selection circuit 22 is further configured to provide two output signals, 'OutA' (from ring oscillator 23) and 'OutB' and (from ring oscillator 24). Clock signals may be conveyed from 'OutA' and 'OutB' regardless of the operating mode.

When the selection signal is in a first state, the signals provided on 'OutA' and 'OutB' may be synchronized with one another. More particularly, selection unit 22 is configured such that, when the selection signal is in the first state, both outputs shown here may provide a rising edge at approximately the same time and further provide a subsequent falling edge at approximately the same time. This may be accomplished despite ring oscillator 23 having a transfer characteristic that is different from ring oscillator 24. Additional details illustrating edge synchronization for one embodiment will be discussed below.

When the selection signal is in a second state, ring oscillators 23 and 24 may operate independently of one another. Accordingly, the edges of clock signals produced by these two ring oscillators may not be synchronized with one another at all voltages of Vdd that may be received by each. Since ring oscillators 24 and 24 may have different transfer characteristics with respect to one another, the frequencies of the respective clock signals may also vary differently responsive to changes in the supply voltage Vdd.

The operation of ring oscillators 23 and 24 in a synchronized mode may occur when the enable signal is asserted. When the enable signal is de-asserted, ring oscillators 23 and 24 may be inhibited from synchronized operation. The enable signal may also be used to perform an initial synchronization of ring oscillators 23 and 24 at any time clock generator 20 is powered on, exits a sleep state, or undergoes a power-on reset. Initial synchronization may be accomplished by pulsing (i.e. momentarily asserting then de-asserting) the enable signal for a sufficient amount of time to allow a clock edge (rising or falling) to propagate through both ring oscillators 23 and 24. After propagating through each of ring oscillators 23 and 24, the clock edge may arrive at each of the 'A' and 'B' inputs. Subsequent to the arrival of the clock edge at the 'A' and 'B' inputs, the enable signal may be re-asserted (with the selection signal in the first state) to allow the ring oscillators to begin synchronized operation.

Figure 3:
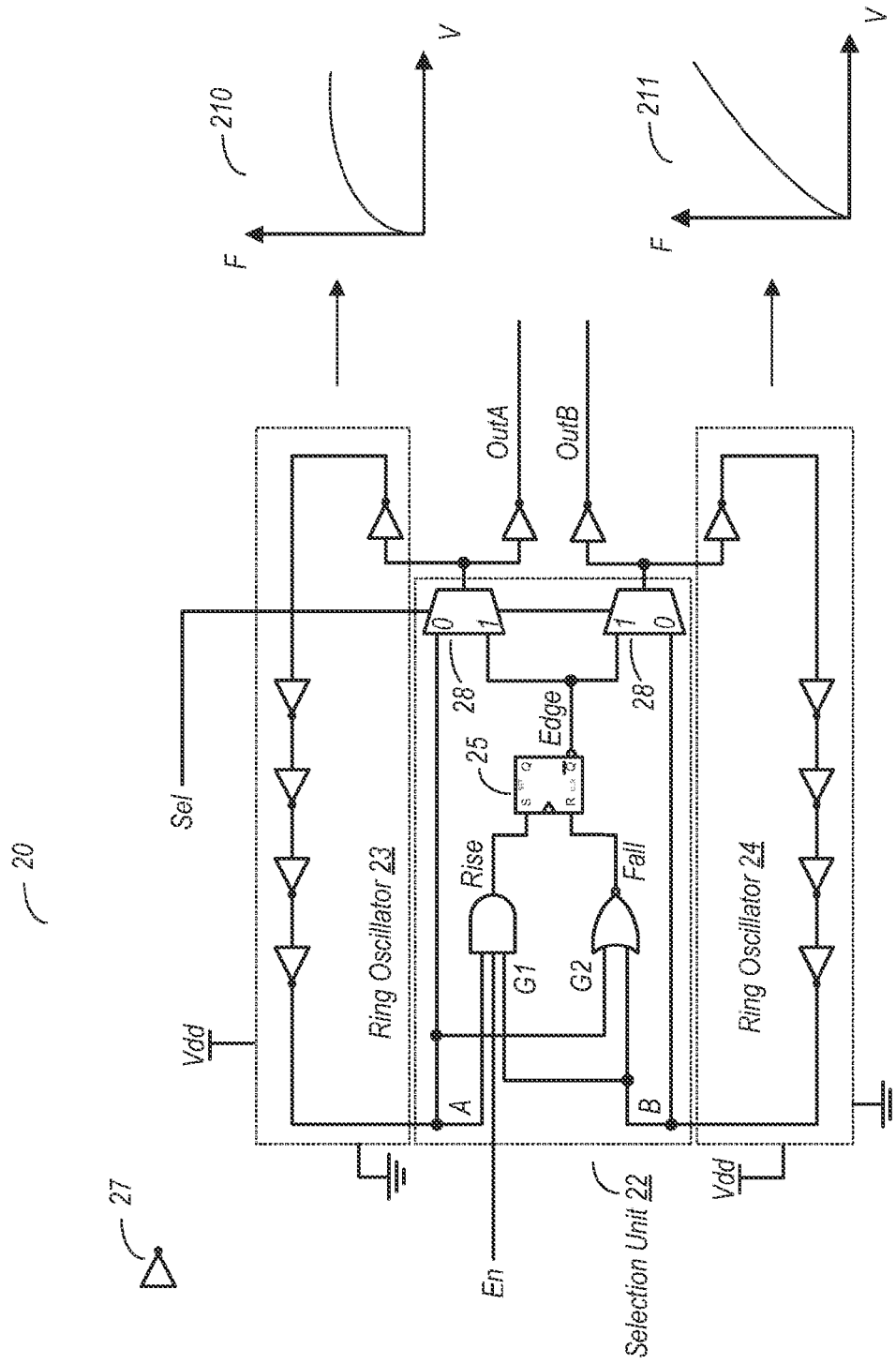
FIG. 3 is a logic diagram illustrating one embodiment of a circuit configured to provide a synchronized output for two different ring oscillators.

Turning now to FIG. 3, a logic diagram illustrating one embodiment of a circuit configured to provide a synchronized output for two different ring oscillators is shown. As with the embodiment shown in FIG. 2, clock generator 20 includes ring oscillator 23, ring oscillator 24, and selection unit 22. Each of ring oscillators 23 and 24 include an odd number of inverters 27 in order to generate periodic (or oscillating) signals. It is noted however that embodiments are possible and contemplated wherein selection unit 22 implements an inverting stage, and in such cases, ring oscillators 23 and 24 can use an even number of inverters 27 since the total number of inversions through each ring oscillator loop would still be odd.

In the embodiment shown, ring oscillator 23 may be characterized by an exemplary first transfer curve 210, while ring oscillator 24 may be characterized by an exemplary second transfer curve 211. The respective transfer curves in the embodiment shown illustrated exemplary relationships between a received supply voltage (Vdd in this example) and the frequency of an output signal when the oscillators are operating independently of one another. The transfer characteristics exemplified by the respective transfer curves may be varied from one ring oscillator to the next by varying certain parameters of the transistors used to implement inverters 27 in each. Thus, the transistors used to implement ring oscillator 23 may have different operating parameters with respect to those used to implement ring oscillator 24. Furthermore, based on the respective transfer characteristics, one of ring oscillators 23 and 24 may be better suited for operation with transistor-dominated paths, while the other one may be better suited for operation with wire-dominated paths.

Selection unit 22 in the embodiment shown includes a logic gates G1 and G2, a set-reset (SR) flop 25, and two multiplexers 28. Operation in a synchronized mode may occur when both the enable and select signals are asserted (e.g., as a logic 1) in this embodiment. When the selection signal is asserted, the '1' input of each multiplexer 28 is selected to be transparent to its respective output.

SR flop 25 in the embodiment shown may be a set-reset latch or set-reset flip-flop. It is noted embodiments using other types of latches/flip-flops (e.g., D, JK, etc.) are possible and contemplated. Logic circuitry used to provide one or more inputs to such latches/flip-flops may also be varied in different embodiments in order to cause rising and falling edges to be propagated into ring oscillators 23 and 24 during operation in the synchronized mode.

Logic gates G1 and G2 may be respectively used to cause the generation of rising and falling clock edges by SR flop 25 when operating in the synchronized mode. Logic gate G1, implemented as an AND gate in this embodiment, may propagate a rising edge responsive to both it's 'A' and 'B' inputs transitioning high when operating in the synchronized mode. When both of these inputs are high, logic gate G1 may assert a signal on the 'Rise' node. The 'Rise' signal may be received on the 'S' input of SR flop 25. Responsive to receiving the 'Rise' signal on the 'S' input, SR flop 25 may drive the 'Edge' signal high, which may then propagate through each of multiplexers 28 and thus through ring oscillators 23 and 24.

Since ring oscillators 23 and 24 may have different transfer characteristics, respectively produced rising clock edges (and thus logic 1's) may be received at the 'A' and 'B' inputs at different times. Accordingly, the 'Rise' signal may not be asserted until logic gate G1 has received rising clock edges (and thus, logic 1's) on both of its 'A' and 'B' inputs. Therefore, selection unit 22 is arranged to propagate the slowest (or most recently received) rising edge into ring oscillators 23 and 24 when operating in the synchronized mode.

Falling edges may be propagated into ring oscillators 23 and 24 via logic gate G2. In the embodiment shown, logic gate G2 is implemented as a NOR gate, and is configured to assert the 'Fall' signal on its output. Since G2 is a NOR gate in this embodiment, the 'Fall' signal is asserted as a logic high whenever both the 'A' and 'B' inputs thereto are low (logic 0). When both the 'A' and 'B' inputs are low, the asserted 'Fall' signal generated by logic gate G2 may be received on the R input of SR flop 25. Responsive to assertion of the 'Fall' signal, SR flop 25 may drive the 'Edge' signal low. The low from the 'Edge' signal may then propagate through multiplexers 28 and into ring oscillators 23 and 24.

The different transfer characteristics of ring oscillators 23 and 24 noted above may cause falling edges to arrive at the 'A' and 'B' inputs at different times. Since logic gate G2 is configured such that the 'Fall' signal is asserted only when both the 'A' and 'B' inputs are low, the slowest (or most recently received) falling edge is the one that is propagated into ring oscillators 23 and 24 when operating in the synchronized mode.

Operation in a free-running mode may be initiated by setting the selection signal to a logic 0. When the selection signal is a logic 0 in the embodiment shown, the '0' input of each multiplexer 28 is transparent to its respective output. In the free-running mode, ring oscillators 23 and 24 may each operate independently of one another, and thus their clock edges may also be generated independently of each another.

Figure 4:
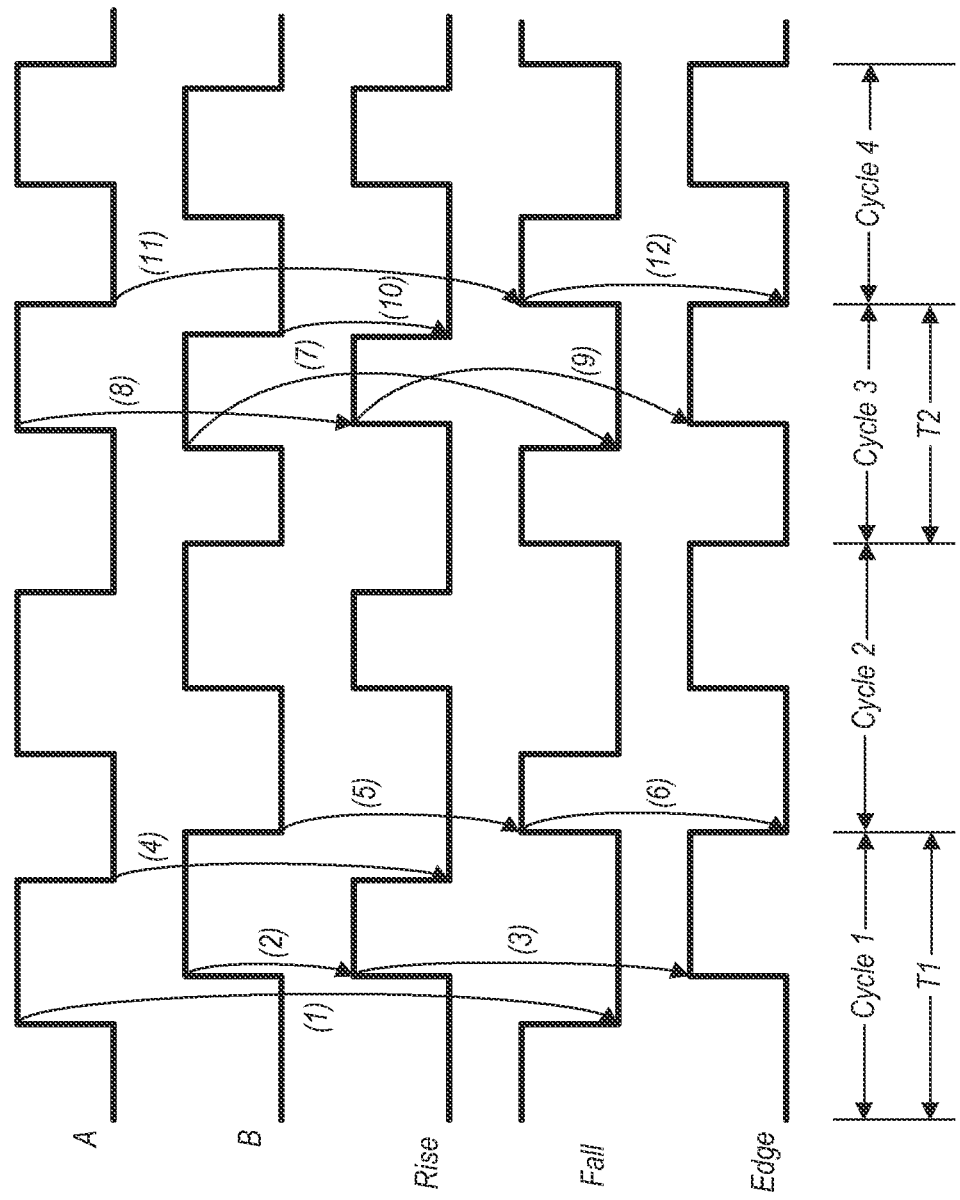
FIG. 4 is a timing diagram illustrating operation of an embodiment of a circuit configured to provide a synchronized output for two different ring oscillators.

FIG. 4 is a timing diagram illustrating operation of one embodiment of a circuit configured to provide a synchronized output for two different ring oscillators. More particularly, FIG. 4 illustrates operation in the synchronized mode for one embodiment of clock generator 20. For the sake of illustration, the example shown here is discussed in the context of the embodiment illustrated in FIG. 3. However, it is understood that other embodiments of clock generator 20 that are capable of producing a similar timing diagram are possible and contemplated. Accordingly, the example shown here is not limited to the embodiment of FIG. 3. The example shown here further assumes that the enable signal is asserted. The operation depicted herein occurs over four cycles (Cycle 1-Cycle 4), with the first two cycles having a period of T1 and the next two cycles having a period of T2.

The example illustrated in FIG. 4 begins with lows on inputs 'A' and 'B', a low for the 'Rise' signal, a high for the 'Fall' signal, and a low for the 'Edge' signal. When 'A' transitions high, the 'Fall' signal falls low at (1) due to the high on the 'A' input of G2. Although 'A' has transitioned high at this point, no rising edge is propagated into the ring oscillators, since 'B' is still low (resulting in a low on the output of G1). When the rising edge is received on the 'B' input (i.e. 'B' transitions high), both the 'A' and 'B' inputs to G1 are high. Responsive to receiving a logic high on both the 'A' and 'B' inputs, G1 asserts the 'Rise' signal (2). The assertion of the 'Rise' signal is received by the 'S' input of SR flop 25, which asserts the 'Edge' signal responsive thereto (3). The rising edge of the 'Edge' signal (and thus the logic high of the same) is thus propagated into both ring oscillators 23 and 24 at the same time.

At (4), 'A' falls low, as signals propagate through ring oscillator 23 faster than ring oscillator 24 in this particular example. Responsive to 'A' falling low, the 'Rise' signal also falls low. However, since the 'B' signal is still high at (4), no change occurs to the 'Edge' signal. At (5), the 'B' signal falls low, and thus the 'Fall' signal is asserted on the output of G2 responsive to it receiving two low inputs. The assertion of the 'Fall' signal results in a high on the 'R' input of SR flop 25, thereby causing the 'Edge' signal to fall low. The falling edge of the 'Edge' signal (and thus the logic low of the same) is thus propagated into both ring oscillators 23 and 24.

The pattern of (1)-(6) repeats in Cycle 2. Since ring oscillator 23 allows for faster signal propagation than ring oscillator 24 for Cycles 1-2 in this example, the slowest (or most recent) clock edges are propagated from the latter, although this does not apply to all embodiments and/or all situations.

In Cycles 3-4, the frequency of operation of ring oscillators 23 and 24 has been increased due to a voltage change (although the voltage change is not shown here for the sake of simplicity). Accordingly, period T2 is shorter in duration than period T1.

At the beginning of Cycle 3, both 'A' and 'B' are low and 'Fall' is high. At (7), 'B' transitions high, and thus causes 'Fall' to transition low. 'Edge' remains unchanged at this point, since 'A' is still low. When 'A' transitions high at (8), both 'A' and 'B' are high, and thus 'Rise' transitions high. The high on 'Rise' is received at the 'S' input of SR flop 25, which thus causes 'Edge' to transition high at (9). Thus, a rising edge (and subsequent logic high) is propagated from SR flop 25 into ring oscillators 22 and 23.

In the example shown, ring oscillator 24 has a transfer characteristic such that signals propagate through it faster than ring oscillator 23 when operating at the voltage corresponding to period T2. Accordingly, at (10), 'B' falls low, thereby causing 'Rise' to also fall low. 'Edge' remains high at this point, since the inputs to G2 are low on 'B' and high on 'A'. At (11), 'A' falls low, and thus the output of G2, 'Fall', transitions from low to high. The low-to-high transition of 'Fall' is received on the 'R' input of SR flop 25, thereby causing the 'Edge' signal to fall low (12). Accordingly, the falling edge and subsequent logic low of 'Edge' is propagated into ring oscillators 23 and 24. The pattern outlines from (8)-(12) repeats itself in Cycle 4.

Figure 5:
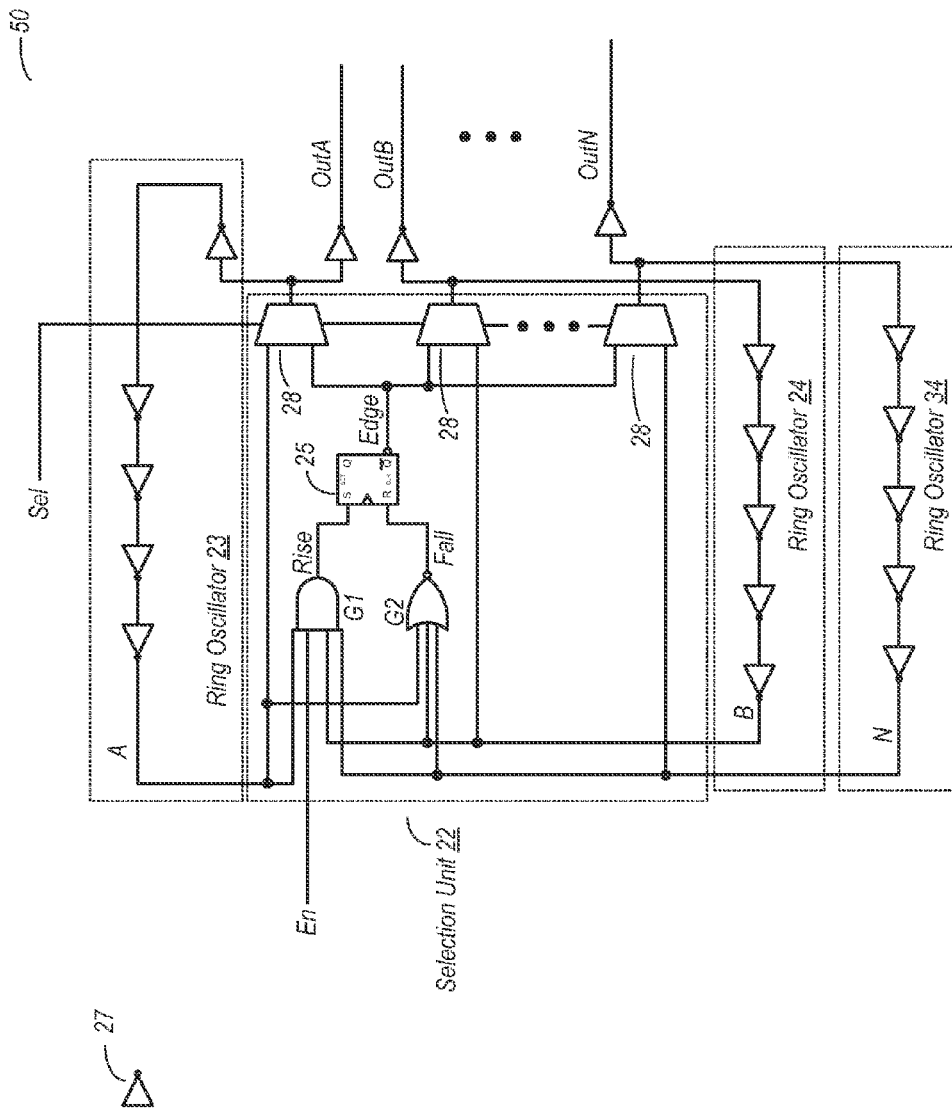
FIG. 5 a logic diagram illustrating one embodiment of a circuit configured to provide a synchronized output for a number of ring oscillators greater than two.

FIG. 5 a logic diagram illustrating one embodiment of a circuit configured to provide a synchronized output for a number of ring oscillators greater than two. In the embodiment shown, clock generation unit 50 includes N ring oscillators, including ring oscillator 23, ring oscillator 24, and ring oscillator 34. The value of N may be an integer value, and is limited only by the number of ring oscillators that are practical for a given implementation.

Clock generation unit 50 in the embodiment shown operates on a principle similar to that of clock generation unit 20 of FIG. 2. When operating in the synchronized mode, the clock edges provided on 'OutA', 'OutB', and all other outputs up to 'OutN' may be synchronized to one another. Furthermore, clock edges are generated responsive to a slowest (or most recently received) clock edge from all of the ring oscillators. Thus, even if the ring oscillators have different transfer characteristics, their respective outputs (e.g., 'OutA', 'OutB', etc.) will provide rising and falling clock edges synchronously with each other in this embodiment.

Using a larger number of ring oscillators each with different transfer characteristics may result in a clock generation apparatus having a finer granularity with respect to sensitivity over a range of voltages. Accordingly, clock generator 50 may be suitable for use with clocked circuits that may operate over a wide range of voltages. Each ring oscillator may be designed such that its transfer characteristic is suitable for a particular voltage or small range of voltages. When operating at a voltage best adapted to its transfer characteristic, a particular ring oscillator may be dominant with respect to the others.

Figure 6:
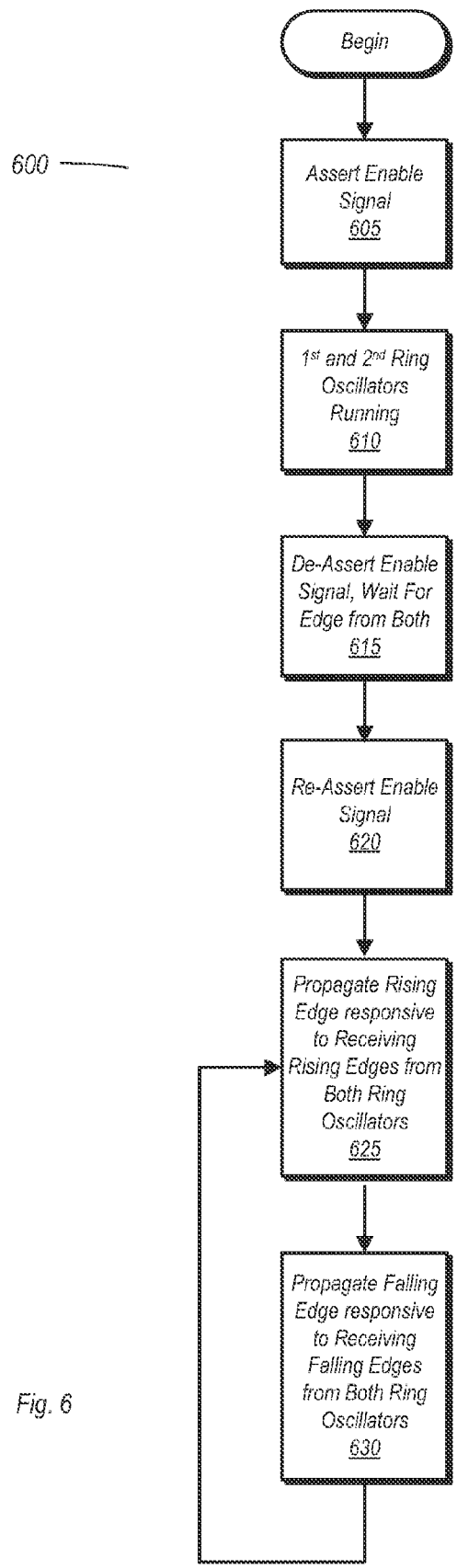
FIG. 6 is a flow diagram illustrating a method for initializing and operating a circuit having multiple ring oscillators.

Turning now to FIG. 6, a flow diagram illustrating a method for initializing and operating a circuit having multiple ring oscillators is illustrated. Method 600 is discussed herein in the context of clock generator 20 of FIG. 3. However, it is noted that this method may be applied to embodiments other than the one discussed in FIG. 3, as well as embodiments that are not explicitly discussed elsewhere in this disclosure. In general, method 600 as discussed herein may be applied to any apparatus capable of performing the same. It is further noted that method 600 is described herein with reference to operation in the synchronized mode previously described.

Method 600 in the embodiment begins with an initial assertion of the enable signal (block 605), which is an input to gate G2. The assertion of the enable signal may be in the form of a short duration pulse. The enable signal may be held asserted for a time sufficient to allow ring oscillators 23 and 24 to start operating (block 610) and thus for a clock edge to be propagated into both from selection unit 22. The enable signal may then be de-asserted, and may remain so for at least an amount of time sufficient to allow the clock edge to propagate through both ring oscillators and provide the corresponding logic level back to the 'A' and 'B' inputs of selection unit 22 (block 615). This initialization process may clear the ring oscillators of other clock edges and place both of them at a known starting point for further operation such that synchronization can be achieved and maintained.

Subsequent to selection unit 22 receiving the logic level corresponding to the propagated clock edge at both the 'A' and 'B' inputs, the enable signal may be asserted once again (block 620). Assertion of the enable signal may allow ring oscillators 23 and 24 to begin operation in the synchronized mode. After receiving rising edges (and thus, logic highs) on both the 'A' and 'B' inputs, selection unit 22 may propagate rising edges and their corresponding logic highs to both ring oscillators 23 and 24 (block 625). After receiving falling edges (and thus logic lows) on both the 'A' and 'B' inputs, selection unit 22 may propagate falling edges and their corresponding logic lows into both ring oscillators 23 and 24 (block 630). The cycle of propagating rising and falling edges of blocks 625 and 630 may repeat as long as operation in the synchronized mode continues.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
a first ring oscillator configured to generate a first periodic signal;
a second ring oscillator configured to generate a second periodic signal; and
a selection unit coupled to receive the first periodic signal and the second periodic signal, wherein the selection unit is configured to convey a first clock edge into each of the first and second ring oscillators responsive to a most recently received rising edge from one of the first and second periodic signals, and wherein the selection unit is further configured to convey a second clock edge into each of the first and second ring oscillators responsive to a most recently received falling edge from one of the first and second periodic signals, wherein the first and second clock edges are opposite in direction wherein the selection unit includes:
a first logic gate coupled to receive, as inputs, the first and second periodic signals;
a second logic gate coupled to receive, as inputs, the first and second periodic signals;
a set-reset (SR) flop having a set input coupled to receive an output from the first logic gate and a reset input coupled to receive an output from the second logic gate, and an output coupled to convey the first and second clock edges into each of the first and second ring oscillators.

2. The circuit as recited in claim 1, wherein the selection unit includes an enable input, wherein the selection unit is configured to inhibit the SR flop from providing the first and second clock edges into each of the first and second ring oscillators when an enable signal received on the enable input is de-asserted.

3. The circuit as recited in claim 1, wherein the selection unit includes a first multiplexer having a first input coupled to receive the first periodic signal from the first ring oscillator and a second input coupled to the output of the SR flop, and a second multiplexer having a third input coupled to receive the second periodic signal from the second multiplexer and a fourth input coupled to the output of the SR flop, wherein each of the first and second multiplexers includes a selection input.

4. The circuit as recited in claim 3, wherein the SR flop is configured to convey the first and second clock edges to each of the first and second ring oscillators responsive to selection signal received on the selection input being in a first state, and wherein the first and second ring oscillators are configured to operate independent of one another responsive to the selection signal being in a second state.

5. The circuit as recited in claim 1, wherein the first ring oscillator has a first transfer characteristic, and wherein the second ring oscillator has a second transfer characteristic different from the first.

6. The circuit as recited in claim 1, wherein the selection unit is configured to convey a falling clock edge into each of the first and second ring oscillators responsive to the most recently received rising edge from the first and second periodic signals, and wherein the selection unit is further configured to convey a rising clock edge into each of the first and second ring oscillators responsive to the most recently received falling edge from the first and second periodic signals.

7. A method comprising:
a first ring oscillator generating a first periodic signal;
a second ring oscillator generating a second periodic signal;
a selection unit conveying a first clock edge into each of the first and second ring oscillators responsive to a most recently received rising clock edge from one of the first and second periodic signals; and
the selection unit conveying a second clock edge into each of the first and second ring oscillators responsive to a most recently received falling clock edge from one of the first and second periodic signals, wherein the first and second clock edges occur in opposite directions; wherein the method further comprises:
a first logic gate of the selection unit asserting a set signal responsive to the first and second periodic signals transitioning to a first level;
a second logic gate of the selection unit asserting a reset signal responsive to the first and second periodic signals transitioning to a second level;
a set-reset (SR) flop of the selection unit launching the first clock edge into each of the first and second ring oscillators responsive to the first logic gate asserting the set signal; and
the SR flop launching the second clock edge into each of the first and second ring oscillators responsive to the second logic gate asserting the reset signal, wherein the second transition is in a direction opposite of the first transition.

8. The method as recited in claim 7, further comprising:
providing an enable signal to the selection unit; and
inhibiting the SR flop from launching either of the first or second edges into the first and second ring oscillators when the enable signal is de-asserted.

9. The method as recited in claim 7, wherein the selection unit includes:
a first multiplexer having a first input coupled to receive the first periodic signal from the first ring oscillator, a second input coupled to an output of the SR flop, and a third input coupled to receive a selection signal;
a second multiplexer having a fourth input coupled to receive the second periodic signal from the second ring oscillator, a fifth input coupled to the output of the SR flop, and a sixth input coupled to receive the selection signal.

10. The method as recited in claim 9, further comprising:
conveying the first and second transitions into each of the first and second ring oscillators responsive to the selection signal being in a first state; and
operating the first and second ring oscillators independent of one another responsive to the selection signal being in a second state.

11. The method as recited in claim 8, further comprising performing a power-on reset routine, wherein performing the power-on reset routine includes:
asserting the enable signal;
the SR flop launching a rising clock edge into each of the first and second ring oscillators;
de-asserting the enable signal; and
re-asserting the enable signal subsequent to the first logic gate receiving rising edges from each of the first and second periodic signals.

12. The method as recited in claim 7, wherein the first ring oscillator is characterized by a first voltage-frequency relationship, and wherein the second ring oscillator is characterized by a second voltage-frequency relationship different from the first voltage-frequency relationship.

13. An integrated circuit comprising:
a plurality of ring oscillators, wherein each of the plurality of ring oscillators is configured to generate a respective one of a plurality of periodic signals;
a selection unit coupled to receive each of the plurality of periodic signals, wherein the selection unit is configured to convey a first clock edge into each of the plurality of ring oscillators responsive to determining that each of the periodic signals being at a first level, and wherein the selection unit is further configured to convey a second clock edge into each of the plurality of ring oscillators responsive to determining that each of the periodic signals is at a second logic level, wherein the first and second clock edges occur in opposite directions, wherein the selection unit includes:
a first logic gate having a first plurality of inputs, wherein the first plurality of inputs includes a first subset of inputs each coupled to receive a respective one of the plurality of periodic signals;
a second logic gate having a second plurality of inputs each coupled to receive a respective one of the plurality of periodic signals; and
a set-reset (SR) flop having a set input coupled to receive an output from the first logic gate, a reset input coupled to receive an output from the second logic gate, and an output coupled to convey the first and second clock edges into each of the plurality of ring oscillators.

14. The integrated circuit as recited in claim 13, wherein the first plurality of inputs includes an enable input, wherein the selection unit is configured to inhibit the SR flop from providing the first and second clock edges to each of the plurality of ring oscillators responsive to de-assertion of an enable signal received on the enable input.

15. The integrated circuit as recited in claim 13, wherein the selection unit includes a plurality of multiplexers, wherein each of the plurality of multiplexers includes:
a first input coupled to receive on of the plurality of periodic signals from a respective one of the plurality of ring oscillators;
a second input coupled to an output of the SR flop;
an output coupled to the respective one of the plurality of ring oscillators; and
a selection input.

16. The integrated circuit as recited in claim 15, wherein the SR flop is configured to convey the first and second clock edges into each of the plurality of ring oscillators responsive to a selection signal received on the selection input being in a first state, and wherein each of the plurality of ring oscillators is configured to operate independently of each of the other ones of the plurality of ring oscillators responsive to the selection signal being in a second state.

17. The integrated circuit as recited in claim 13, wherein each of the plurality of ring oscillators is characterized by a different voltage-frequency relationship with respect to each of the other ones of the plurality of ring oscillators.

* * * * *

UNITED STATES PATENT AND TRADEMARK OFFICE
CERTIFICATE OF CORRECTION

PATENT NO. : 8,395,454 B2  
APPLICATION NO. : 13/107079  
DATED : March 12, 2013  
INVENTOR(S) : Horel Page 1 of 1

It is certified that error appears in the above-identified patent and that said Letters Patent is hereby corrected as shown below:

In the Claims:

In column 10, line 42, in Claim 15, delete "on" and insert -- one --, therefor.

Signed and Sealed this  
Fourth Day of June, 2013

Teresa Stanek Rea  
*Acting Director of the United States Patent and Trademark Office*